(12) United States Patent
Hwang et al.

(10) Patent No.: US 8,981,203 B2
(45) Date of Patent: Mar. 17, 2015

(54) THIN FILM SOLAR CELL MODULE

(75) Inventors: Suntae Hwang, Seoul (KR); Dongjoo You, Seoul (KR); Sungeun Lee, Seoul (KR); Seungyoon Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 111 days.

(21) Appl. No.: 13/556,838

(22) Filed: Jul. 24, 2012

(65) Prior Publication Data

US 2013/0081667 A1 Apr. 4, 2013

(30) Foreign Application Priority Data

Oct. 4, 2011 (KR) .................... 10-2011-0100538

(51) Int. Cl.
| | | |
|---|---|---|
| H01L 31/00 | (2006.01) | |
| H01L 31/18 | (2006.01) | |
| H01L 31/075 | (2012.01) | |
| H01L 31/0352 | (2006.01) | |
| H01L 31/046 | (2014.01) | |

(52) U.S. Cl.
CPC .......... *H01L 31/1804* (2013.01); *H01L 31/075* (2013.01); *H01L 31/1812* (2013.01); *Y02E 10/52* (2013.01); *H01L 31/0352* (2013.01); *Y02E 10/548* (2013.01); *Y02E 10/547* (2013.01); *H01L 31/046* (2013.01)
USPC .......................................... 136/244; 136/261

(58) Field of Classification Search
CPC ...................................................... H01I 31/042
See application file for complete search history.

(56) References Cited

U.S. PATENT DOCUMENTS

| | | | | |
|---|---|---|---|---|
| 4,379,943 | A * | 4/1983 | Yang et al. ..................... | 136/249 |
| 6,380,478 | B1 * | 4/2002 | Yamamoto et al. ........... | 136/244 |
| 2008/0216886 | A1 | 9/2008 | Iwakura | |
| 2011/0017257 | A1 * | 1/2011 | Lee et al. ...................... | 136/244 |
| 2011/0041901 | A1 * | 2/2011 | Shim et al. .................... | 136/255 |
| 2011/0061706 | A1 * | 3/2011 | Park et al. ..................... | 136/244 |

FOREIGN PATENT DOCUMENTS

EP    2 352 180 A1    8/2011

OTHER PUBLICATIONS

Pan Wugen et al: "Ge composition dependence of properties of solar cells based on multicrystalline SiGe with microscopic compositional distribution", Journal of Applied Physics, American Institute of Physics. New York, US, vol. 96, No. 2, Jul. 15, 2004, pp. 1238-1241, XP012068124.

* cited by examiner

*Primary Examiner* — Jeffrey T Barton
*Assistant Examiner* — Uyen Tran
(74) *Attorney, Agent, or Firm* — McKenna Long & Aldridge LLP

(57) ABSTRACT

A thin film solar cell module includes a substrate, at least one first cell positioned in a central area of the substrate, and at least one second cell positioned in an edge area of the substrate. Each of the first and second cells includes a first electrode, a second electrode, and at least one photoelectric conversion unit positioned between the first electrode and the second electrode. An amount of germanium contained in the photoelectric conversion unit of the first cell is less than an amount of germanium contained in the photoelectric conversion unit of the second cell positioned on the same level layer as the photoelectric conversion unit of the first cell.

20 Claims, 10 Drawing Sheets

Eg1 > Eg2 > Eg3 > Eg4

Ge1 < Ge2 < Ge3 < Ge4

THIN FILM SOLAR CELL MODULE

This application claims priority to and the benefit of Korean Patent Application No. 10-2011-0100538 filed in the Korean Intellectual Property Office on Oct. 4, 2011, the entire contents of which are incorporated herein by reference.

BACKGROUND

1. Field of the Disclosure

Embodiments of the invention relate to a thin film solar cell module.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

Single crystal bulk silicon solar cells using silicon wafers have been now commercialized, but have not been aggressively used because of its high manufacturing cost.

Recently, thin film solar cells have been actively studied to solve the problem of the bulk silicon solar cells. In particular, thin film solar cells using amorphous silicon have been greatly spotlighted as a technology capable of fabricating large-sized solar cell modules at a low cost.

SUMMARY

In one aspect, there is a thin film solar cell module including a substrate, at least one first cell positioned in a central area of the substrate, the at least one first cell including a first electrode, a second electrode, and at least one photoelectric conversion unit positioned between the first electrode and the second electrode, and at least one second cell positioned in an edge area of the substrate, the at least one second cell including a first electrode, a second electrode, and at least one photoelectric conversion unit positioned between the first electrode and the second electrode, wherein an amount of germanium (Ge) contained in the photoelectric conversion unit of the first cell is less than an amount of germanium (Ge) contained in the photoelectric conversion unit of the second cell which is positioned on the same level layer as the photoelectric conversion unit of the first cell.

A difference between an average amount of germanium (Ge) contained in the photoelectric conversion unit of the first cell and an average amount of germanium (Ge) contained in the photoelectric conversion unit of the second cell may be about 1% to 20%.

An amount of germanium (Ge) contained in the photoelectric conversion units of the first and second cells, which are positioned on the same level layer, may increase as the photoelectric conversion units go from the first cell to the second cell.

In other words, the amount of germanium (Ge) contained in the photoelectric conversion units of the first and second cells, which are positioned on the same level layer, may gradually increases as the photoelectric conversion units radically go from the central area to the edge area of the substrate.

The amount of germanium (Ge) contained in the photoelectric conversion unit of the first cell may vary along a longitudinal direction of the first cell. More specifically, an amount of germanium (Ge) at both ends of the first cell may be more than an amount of germanium (Ge) in a central portion of the first cell.

For example, the amount of germanium (Ge) contained in the photoelectric conversion unit of the first cell may gradually increase as the photoelectric conversion unit goes from the central portion to the both ends of the first cell along the longitudinal direction of the first cell.

Further, an amount of germanium (Ge) at both ends of the photoelectric conversion unit of the first cell may be substantially equal to an amount of germanium (Ge) contained in a portion of the photoelectric conversion unit of the second cell.

The amount of germanium (Ge) contained in the photoelectric conversion unit of the second cell may vary along a longitudinal direction of the second cell. More specifically, an amount of germanium (Ge) at both ends of the second cell may be more than an amount of germanium (Ge) in a central portion of the second cell.

For example, the amount of germanium (Ge) contained in the photoelectric conversion unit of the second cell may gradually increase as the photoelectric conversion unit goes from the central portion to the both ends of the second cell along the longitudinal direction of the second cell.

An amount of germanium (Ge) contained in a central portion of the photoelectric conversion unit of the second cell may be substantially equal to an amount of germanium (Ge) at both ends of the photoelectric conversion unit of the first cell.

Each of the photoelectric conversion units of the first and second cells may include a p-type semiconductor layer, an intrinsic (called i-type) semiconductor layer, and an n-type semiconductor layer. An average amount of germanium (Ge) contained in the i-type semiconductor layer of the second cell may be more than an average amount of germanium (Ge) contained in the i-type semiconductor layer of the first cell.

A difference between the average amount of germanium (Ge) contained in the i-type semiconductor layer of the second cell and the average amount of germanium (Ge) contained in the i-type semiconductor layer of the first cell may be about 1% to 20%.

An amount of germanium (Ge) contained in the i-type semiconductor layers of the photoelectric conversion units of the first and second cells may gradually increase as the photoelectric conversion units go from a first junction surface abutting on the p-type semiconductor layer and a second junction surface abutting on the n-type semiconductor layer to the inside of the surface between the first and second junction surfaces.

The i-type semiconductor layers of the photoelectric conversion units of the first and second cells, which are positioned on the same level layer, may contain amorphous silicon germanium (a-SiGe) or microcrystalline silicon germanium (μc-SiGe).

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings.

DETAILED DESCRIPTION OF THE EMBODIMENTS

Figure 1:
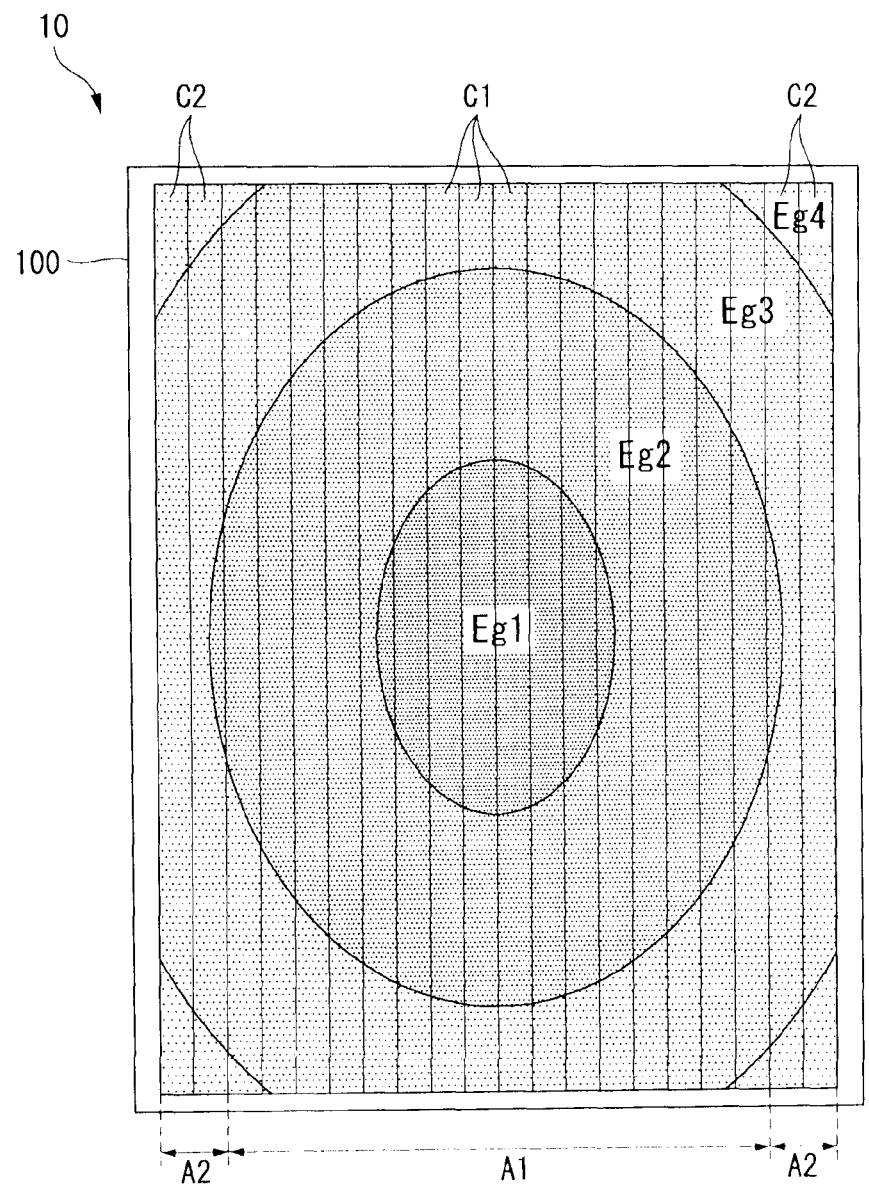
FIG. 1 illustrates a solar cell module according to an exemplary embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be understood that detailed description of known arts may be omitted if it is determined that the arts do not aid in the understanding of the embodiments of the invention.

In the drawings, the thickness of layers, films, panels, regions, etc. may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

Exemplary embodiments of the invention will be described with reference to FIGS. 1 to 11.

FIG. 1 illustrates a solar cell module according to an exemplary embodiment of the invention.

As shown in FIG. 1, a thin film solar cell module 10 according to the exemplary embodiment of the invention includes a substrate 100 and a plurality of thin film solar cells disposed on the substrate 100.

The substrate 100 includes a central area A1 and an edge area A2 positioned at an edge of the central area A1. The plurality of thin film solar cells are positioned in the central area A1 and the edge area A2.

In the following description of the embodiment of the invention, at least one thin film solar cell positioned in the central area A1 is referred to as a first cell C1, and at least one thin film solar cell positioned in the edge area A2 is referred to as a second cell C2.

Large-sized thin film solar cell modules generally having the size of $1.1 \times 1.3$ m$^2$, $1.1 \times 1.4$ m$^2$, or $2.2 \times 2.6$ m$^2$ have been distributed in the market. Each of the thin film solar cell modules having the size of $1.1 \times 1.3$ m$^2$ and $1.1 \times 1.4$ m$^2$ includes solar cells equal to or more than 100.

The embodiment of the invention controls characteristics of the first cell C1 positioned in the central area A1 and the second cell C2 positioned in the edge area A2 to thereby improve the efficiency of the large-sized solar cell module. In the embodiment of the invention, the second cell C2 is defined as at least one outermost cell positioned in the edge area A2 of the substrate 100, and the first cell C1 is defined as at least one cell positioned in the central area A1 of the substrate 100. Thus, the first cell C1 may be all of remaining cells except the second cell C2.

Each of the first cell C1 and the second cell C2 includes a first electrode, a second electrode, and at least one photoelectric conversion unit positioned between the first electrode and the second electrode. The first cell C1 and the second cell C2 of one solar cell module have the same number of photoelectric conversion units.

For example, when the thin film solar cell module is a single junction solar cell module, the first cell C1 and the second cell C2 each have one photoelectric conversion unit. When the thin film solar cell module is a double junction solar cell module, the first cell C1 and the second cell C2 each have two photoelectric conversion units. When the thin film solar cell module is a triple junction solar cell module, the first cell C1 and the second cell C2 each have three photoelectric conversion units. A structure of each of the first cell C1 and the second cell C2 is described in detail later.

In the solar cell module according to the embodiment of the invention, an energy band gap of the photoelectric conversion unit of the second cell C2 is less than an energy band gap of the photoelectric conversion unit of the first cell C1. In this instance, the photoelectric conversion unit of the first cell C1 and the photoelectric conversion unit of the second cell C2 are positioned on the same level layer.

In FIG. 1, Eg1, Eg2, Eg3, and Eg4 indicate energy band gaps of the photoelectric conversion units (positioned on the same level layer) included in the cells of the solar cell module, respectively.

As shown in FIG. 1, the energy band gaps of the photoelectric conversion units (positioned on the same level layer) included in the cells of the solar cell module according to the embodiment of the invention gradually decrease as the photoelectric conversion units radially go from the central area A1 to the edge area A2. Hence, the energy band gaps Eg1, Eg2, Eg3, and Eg4 are as follows: Eg1>Eg2>Eg3>Eg4.

As described above, the energy band gap of the photoelectric conversion unit of the second cell C2 is less than the energy band gap of the photoelectric conversion unit of the first cell C1 which is positioned on the same level layer as the photoelectric conversion unit of the second cell C2.

A location relation of the photoelectric conversion units positioned on the same level layer in the embodiment of the invention is described below.

When the thin film solar cell module is the single junction solar cell module, each photoelectric conversion unit of the single junction solar cell module has a single-layered structure. When the thin film solar cell module is the double junction solar cell module, each photoelectric conversion unit of the double junction solar cell module has a double-layered structure including an upper photoelectric conversion unit and a lower photoelectric conversion unit. In this instance, an upper photoelectric conversion unit of the first cell C1 and an upper photoelectric conversion unit of the second cell C2 are positioned on the same level layer, and a lower photoelectric conversion unit of the first cell C1 and a lower photoelectric conversion unit of the second cell C2 are positioned on the same level layer.

When the thin film solar cell module is the triple junction solar cell module, each photoelectric conversion unit of the triple junction solar cell module has a triple-layered structure. In this instance, for example, a middle photoelectric conversion unit of the first cell C1 and a middle photoelectric conversion unit of the second cell C2 are positioned on the same level layer, and a lower photoelectric conversion unit of the first cell C1 and a lower photoelectric conversion unit of the second cell C2 are positioned on the same level layer.

The energy band gap of the photoelectric conversion unit of the second cell C2 positioned in the edge area A2 of the substrate 100 may be less than the energy band gap of the photoelectric conversion unit of the first cell C1 positioned in the central area A1 of the substrate 100. This is to prevent a reduction in the entire efficiency of the solar cell module resulting from a reduction in a short circuit current of the second cell C2 positioned in the edge area A2 of the substrate 100 which may be more easily polluted than the central area A1 and corresponds to an output terminal of the solar cell module. This is described in detail with reference to FIGS. 5A and 5B.

As shown in FIG. 1, the energy band gaps of the photoelectric conversion units (positioned on the same level layer) included in the cells of the solar cell module according to the embodiment of the invention gradually decrease (i.e., Eg1>Eg2>Eg3>Eg4) as the photoelectric conversion units radially go from the central area A1 to the edge area A2. Thus, the energy band gaps of the photoelectric conversion units positioned on the same level layer may gradually decrease as the photoelectric conversion units go from the first cell C1 to the second cell C2.

Further, as shown in FIG. 1, the energy band gaps of the photoelectric conversion units included in the first cells C1 may gradually decrease as the photoelectric conversion units go from a central portion of the first cells C1 to both ends of the first cells C1.

For example, the first cells C1 in the central portion may have the energy band gap of Eg1, and the first cells C1 away from the central portion and at both ends may have the energy band gap gradually decreasing from Eg2 to Eg3.

The energy band gap of the photoelectric conversion unit included in each of the cells of the solar cell module may be adjusted by controlling an amount of germanium (Ge) contained in the photoelectric conversion unit.

Figure 2:
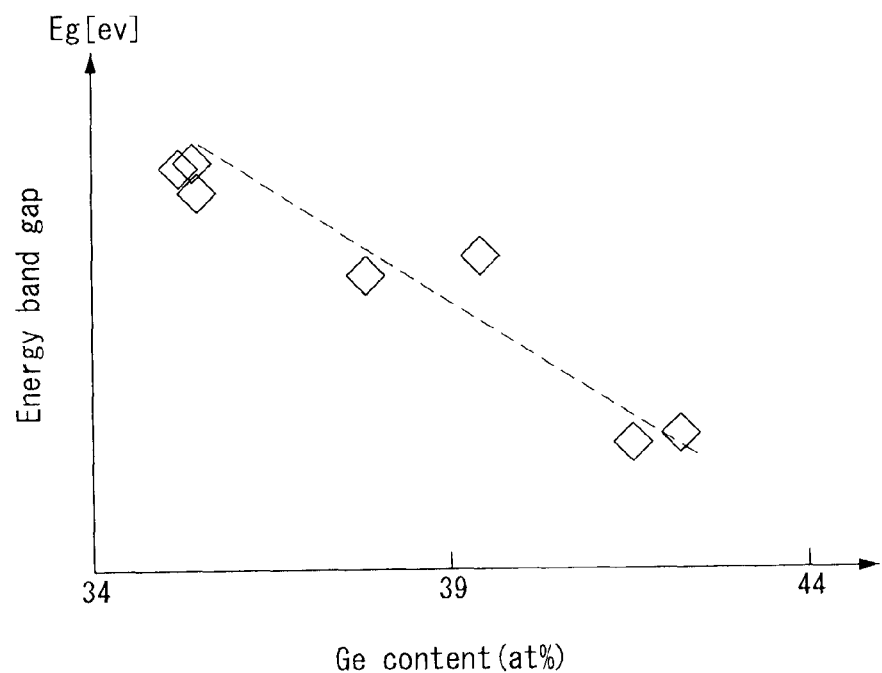
FIG. 2 is a graph illustrating changes in an energy band gap depending on an amount of germanium (Ge) contained in a photoelectric conversion unit of a solar cell.

FIG. 2 is a graph illustrating changes in an energy band gap depending on an amount of germanium (Ge) contained in a photoelectric conversion unit of a solar cell.

As shown in FIG. 2, as an amount of germanium (Ge) contained in the photoelectric conversion unit of the solar cell gradually increases to 34 at %, 39 at %, and 44 at %, an energy band gap Eg may gradually decrease.

The energy band gap of the photoelectric conversion unit included in each of the cells of the solar cell module shown in FIG. 1 may be adjusted using a relationship between the amount of germanium (Ge) and the energy band gap Eg.

Thus, the solar cell module shown in FIG. 1 may be manufactured using the above-described characteristics.

Figure 3:
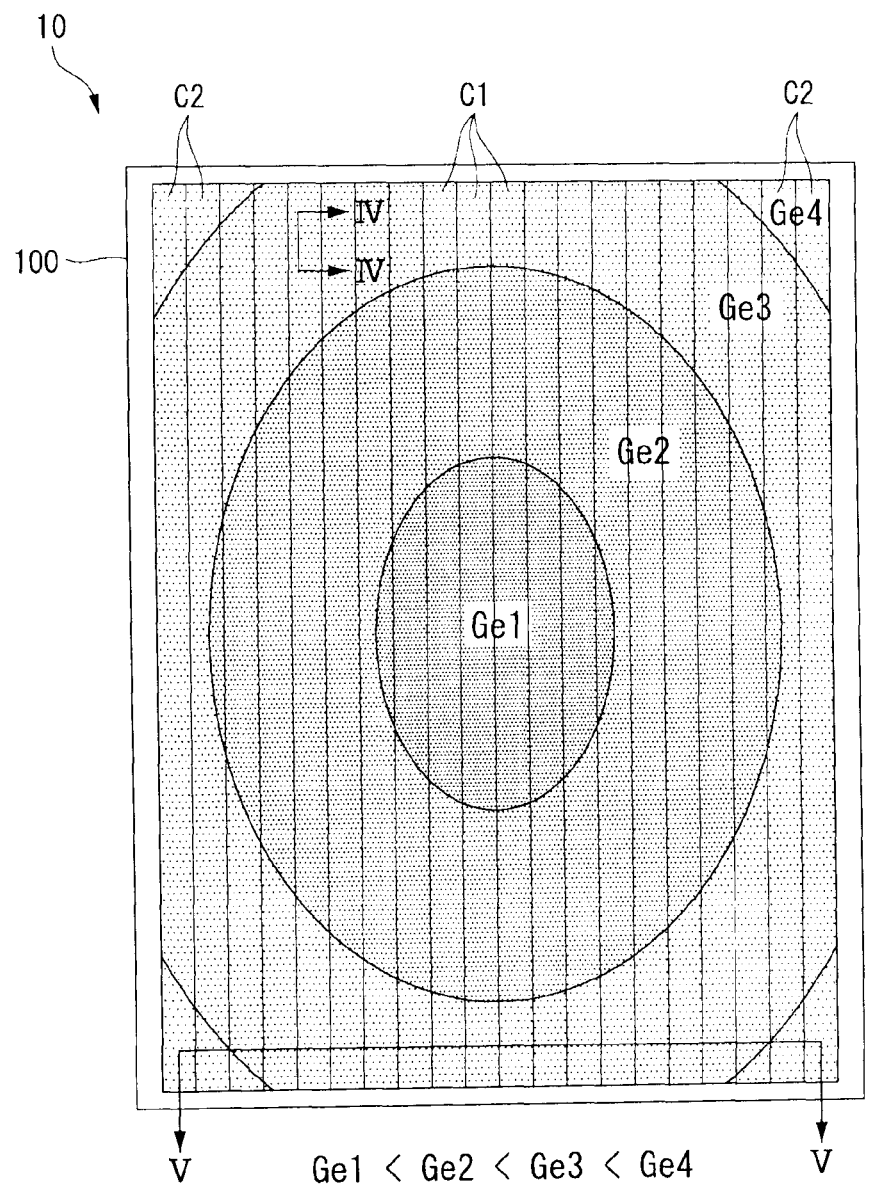
FIG. 3 illustrates an example of the amount of germanium (Ge) contained in a photoelectric conversion unit of a solar cell in the solar cell module shown in FIG. 1.

FIG. 3 illustrates an example of the amount of germanium (Ge) contained in a photoelectric conversion unit of a solar cell in the solar cell module shown in FIG. 1.

More specifically, as shown in FIG. 3, the solar cell module shown in FIG. 1 may be manufactured by controlling the amount of germanium (Ge).

Alternatively, unlike the method illustrated in FIG. 3, the energy band gap of the photoelectric conversion unit of the second cell C2 may be less than the energy band gap of the photoelectric conversion unit of the first cell C1, which is positioned on the same level layer as the photoelectric conversion unit of the second cell C2, using materials other than germanium (Ge).

The embodiment of the invention may be configured, so that the energy band gap of the photoelectric conversion unit of the second cell C2 is less than the energy band gap of the photoelectric conversion unit of the first cell C1 using an inverse proportion relation between the amount of germanium (Ge) and the energy band gap Cg illustrated in FIG. 2.

More specifically, as shown in FIG. 3, an amount Ge4 of germanium (Ge) of the photoelectric conversion unit of the second cell C2 may be more than an amount Ge1 of germanium (Ge) of the photoelectric conversion unit of the first cell C1 (i.e., Ge1<Ge4), so that the energy band gap of the photoelectric conversion unit of the second cell C2 is less than the energy band gap of the photoelectric conversion unit of the first cell C1, which is positioned on the same level layer as the photoelectric conversion unit of the second cell C2.

Further, the amount of germanium (Ge) contained in the photoelectric conversion units positioned on the same level layer gradually increases (i.e., Ge1<Ge2<Ge3<Ge4) as the photoelectric conversion units radially go from the central area A1 to the edge area A2 of the substrate 100. Thus, the amount of germanium (Ge) contained in the photoelectric conversion units positioned on the same level layer may gradually increase as the photoelectric conversion units go from the first cell C1 to the second cell C2.

As a result, the energy band gaps of the photoelectric conversion units positioned on the same level layer may gradually decrease as the photoelectric conversion units go from the first cell C1 to the second cell C2.

In the embodiment of the invention, the amount of germanium (Ge) indicates an average value of the amount of germanium (Ge) contained in the photoelectric conversion units of the first cell C1 and the second cell C2.

A difference between an average amount of germanium (Ge) contained in the photoelectric conversion unit of the first cell C1 and an average amount of germanium (Ge) contained in the photoelectric conversion unit of the second cell C2 may be about 1% to 20%.

For example, when the average amount of germanium (Ge) contained in the photoelectric conversion unit of the first cell C1 is about 30 at %, the average amount of germanium (Ge) contained in the photoelectric conversion unit of the second cell C2 may be about 50 at % at the most.

Thus, in FIG. 3, when an average amount of germanium (Ge) in an area Ge1 is about 30 at % and an average amount of germanium (Ge) in an area Ge4 is about 50 at %, average amounts of germanium (Ge) in the areas Ge2, Ge3, and Ge4 may be greater than about 30 at % and less than about 50 at %.

As described above, when the difference between the average amount of germanium (Ge) contained in the photoelectric conversion unit of the first cell C1 and the average amount of germanium (Ge) contained in the photoelectric conversion unit of the second cell C2 is about 1% to 20%, the efficiency of the solar cell module may be improved. This is described in detail with reference to FIGS. 5A and 5B.

The amount of germanium (Ge) contained in the photoelectric conversion unit of the first cell C1 may vary along a longitudinal direction of the first cell C1. Namely, the amount of germanium (Ge) contained in the photoelectric conversion units of the first cell C1 may gradually increase as the photoelectric conversion units go from the central portion of the first cells C1 to both ends of the first cells C1. Thus, the energy band gaps of the photoelectric conversion units included in the first cells C1 may gradually decrease as the photoelectric conversion units go from the central portion of the first cells C1 to both ends of the first cells C1.

An amount of germanium (Ge) at both ends of the photoelectric conversion units of the first cell C1 and an amount of germanium (Ge) in a middle area of the photoelectric conversion units of the second cell C2 may be equal to each other.

The amount of germanium (Ge) contained in the photoelectric conversion unit of the second cell C2 may vary along a longitudinal direction of the second cell C2. More specifically, the amount of germanium (Ge) in both ends of the second cell C2 may be more than the amount of germanium (Ge) in the central portion of the second cell C2

For example, the amount of germanium (Ge) contained in the photoelectric conversion units of the second cell C2 may gradually increase as the photoelectric conversion units go from the central portion of the second cell C2 to both ends of the second cell C2 along the longitudinal direction of the second cell C2.

FIG. 3 illustrates that the amount of germanium (Ge) of the photoelectric conversion units gradually increases as the photoelectric conversion units go from the central area A1 to the edge area A2 of the substrate 100 when viewing the photoelectric conversion units positioned on the same level layer in the plane.

An amount of germanium (Ge) of the photoelectric conversion units when viewed from the side of the cell is described below.

Figure 4:
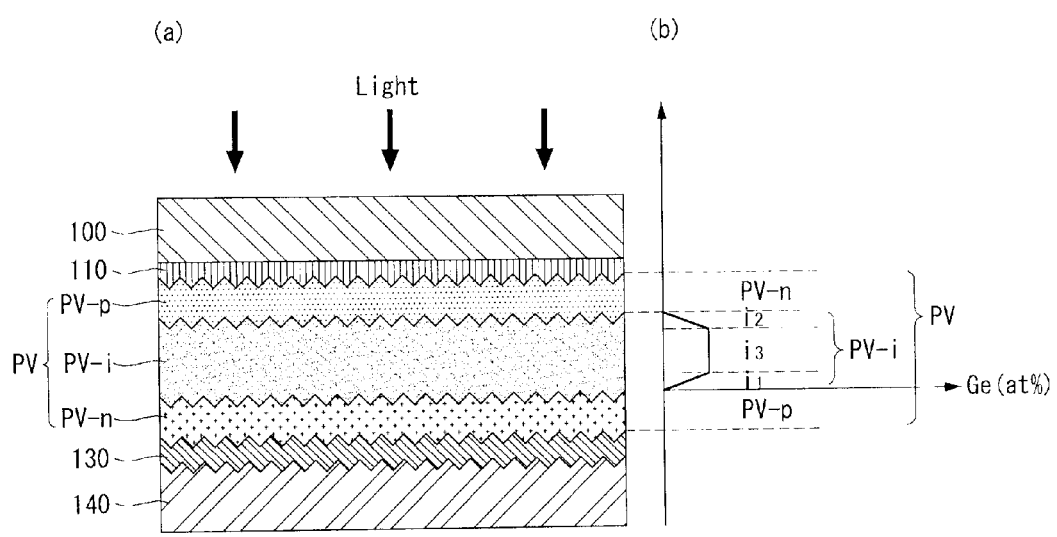
FIG. 4 is a cross-sectional view taken along line IV-IV of FIG. 3 as an example of describing an amount of germanium (Ge) contained in a photoelectric conversion unit.

FIG. 4 is a cross-sectional view taken along line IV-IV of FIG. 3 as an example of describing an amount of germanium (Ge) contained in a photoelectric conversion unit PV.

In FIG. 4, (a) illustrates a single junction solar cell as an example of a side cross-sectional view of the solar cell, and (b) illustrates an amount of germanium (Ge) contained in the photoelectric conversion unit PV.

(a) of FIG. 4 illustrates the side cross-sectional view of the solar cell belonging to the first cell C1 of FIG. 3. In this instance, because each cell of the solar cell module includes the same number of photoelectric conversion units PV, the second cell C2 of FIG. 3 has the cell structure illustrated in (a) of FIG. 4. Thus, a further description except an amount of germanium (Ge) contained in the second cell C2 may be briefly made or may be entirely omitted.

Before describing an amount of germanium (Ge) contained in the photoelectric conversion unit PV with reference to (b) of FIG. 4, a structure and an operation of the solar cell shown in (a) of FIG. 4 is described in detail below.

As shown in (a) of FIG. 4, the thin film solar cell according to the embodiment of the invention includes a substrate 100, a first electrode 110, a photoelectric conversion unit PV, a back reflection layer 130, and a second electrode 140.

(a) of FIG. 4 illustrates the photoelectric conversion unit PV having a p-i-n structure based on the substrate 100. Alternatively, the photoelectric conversion unit PV may have an n-i-p structure based on the substrate 100. In the following description, the photoelectric conversion unit PV having the p-i-n structure based on the substrate 100 is taken as an example for the sake of brevity.

The substrate 100 serves as a base layer providing a space for other functional layers in the processes. The substrate 100 may be formed of a substantially transparent non-conductive material, for example, glass or plastic, so that light incident on the substrate 100 efficiently reaches the photoelectric conversion unit PV.

The first electrode 110 is positioned on the substrate 100 and contains a conductive material capable of transmitting light so as to increase a transmittance of incident light. The first electrode 110 may be electrically connected to the photoelectric conversion unit PV. Hence, the first electrode 110 may collect and output carriers (for example, holes) produced by incident light.

A plurality of uneven portions may be formed on an upper surface of the first electrode 110. Namely, the first electrode 110 may have a textured surface.

As described above, when a texturing process is performed on the surface of the first electrode 110, the first electrode 110 reduces a reflectance of incident light and increases an amount of light absorbed in the photoelectric conversion unit PV. Hence, the efficiency of the solar cell is improved.

Further, a plurality of uneven portions may be formed on surfaces of the photoelectric conversion unit PV as well as the upper surface of the first electrode 110. Hence, the photoelectric conversion unit PV may reduce a reflectance of light incident from the outside and may increase an absorptance of light.

The first electrode 110 may contain one of aluminum zinc oxide (ZnOx:Al) and boron zinc oxide (ZnOx:B).

The second electrode 140 is separated from the first electrode 110 and is positioned on the photoelectric conversion unit PV. The second electrode 140 may be formed of metal with high electrical conductivity so as to increase a recovery efficiency of electric power generated by the photoelectric conversion unit PV. The second electrode 140 may be electrically connected to the photoelectric conversion unit PV and may collect and output carriers (for example, electrons) produced by incident light.

The first electrode 110 and the second electrode 140 may be formed as a metal layer containing at least one of silver (Ag) and aluminum (Al) with high electrical conductivity.

The photoelectric conversion unit PV is positioned between the first electrode 110 and the back reflection layer 130 and converts light incident on the substrate 100 from the outside into the electric power.

The photoelectric conversion unit PV may have the p-i-n structure including a p-type semiconductor layer PV-p, an intrinsic (called i-type) semiconductor layer PV-i, and an n-type semiconductor layer PV-n that are sequentially formed on the incident surface of the substrate 100 in the order named. Other layers may be included or present in the photoelectric conversion unit PV. In another embodiment, the n-type semiconductor layer PV-n, the i-type semiconductor layer PV-i, and the p-type semiconductor layer PV-p may be sequentially formed on the incident surface of the substrate 100 in the order named.

The p-type semiconductor layer PV-p may be formed using a gas obtained by adding impurities of a group III element, such as boron (B), gallium (Ga), and indium (In), to a raw gas containing silicon (Si).

The i-type semiconductor layer PV-i may prevent or reduce a recombination of carriers and may absorb light. The i-type semiconductor layer PV-i may absorb incident light to produce carriers such as electrons and holes.

The i-type semiconductor layer PV-i may contain germanium (Ge)-containing amorphous silicon (a-SiGe) or germanium (Ge)-containing microcrystalline silicon (μc-SiGe).

Germanium (Ge) reduces the energy band gap, thereby increasing the absorptance of light and improving a short circuit current Isc of the photoelectric conversion unit PV.

Amorphous silicon has an advantage in absorbing light of a short wavelength band, and microcrystalline silicon has an advantage in absorbing light of a long wavelength band.

Thus, when the plurality of photoelectric conversion units PV are formed, amorphous silicon may be used in a photoelectric conversion unit PV close to the incident surface of the substrate 100, and microcrystalline silicon may be used in a photoelectric conversion unit PV away from the incident surface of the substrate 100.

The n-type semiconductor layer PV-n may be formed using a gas obtained by adding impurities of a group V element, such as phosphorus (P), arsenic (As), and antimony (Sb), to a raw gas containing silicon (Si).

The photoelectric conversion unit PV may be formed using a chemical vapor deposition (CVD) method, such as a plasma enhanced CVD (PECVD) method.

As shown in (a) of FIG. 4, doped layers, for example, the p-type semiconductor layer PV-p and the n-type semiconductor layer PV-n of the photoelectric conversion unit PV may form a p-n junction along with the i-type semiconductor layer PV-i interposed between the doped layers.

The back reflection layer 130 is positioned between the photoelectric conversion unit PV and the second electrode 140 and reflects light not absorbed by the photoelectric conversion unit PV to the photoelectric conversion unit PV.

The back reflection layer 130 may contain one of aluminum zinc oxide (ZnOx:Al), boron zinc oxide (ZnOx:B), and silicon oxide (SiOx).

The back reflection layer 130 may be omitted, if desired or necessary. If the back reflection layer 130 is omitted, the second electrode 140 may perform a function of the back reflection layer 130.

In the single junction solar cell shown in (a) of FIG. 4, the i-type semiconductor layer PV-i may contain germanium (Ge).

Thus, an average amount of germanium (Ge) contained in an i-type semiconductor layer of the second cell C2 may be more than an average amount of germanium (Ge) contained in the i-type semiconductor layer PV-i of the first cell C1.

More specifically, a difference between the average amount of germanium (Ge) contained in the i-type semiconductor layer of the second cell C2 and the average amount of germanium (Ge) contained in the i-type semiconductor layer PV-i of the first cell C1 may be about 1% to 20%. This is described in detail with reference to FIGS. 5A and 5B.

As shown in (b) of FIG. 4, the amount of germanium (Ge) contained in the i-type semiconductor layers PV-i of the first and second cells C1 and C2 may gradually increase going from a first junction surface abutting on the p-type semiconductor layer PV-p and a second junction surface abutting on the n-type semiconductor layer PV-n to a third intrinsic region i3 of the i-type semiconductor layer PV-i between the first and second junction surfaces.

More specifically, a first intrinsic region i1 of the i-type semiconductor layer PV-i including the first junction surface does not contain germanium (Ge) at the first junction surface. Alternatively, the first intrinsic region i1 may contain about 1 to 5 at % of germanium (Ge). The amount of germanium (Ge) contained in the i-type semiconductor layer PV-i may increase as the i-type semiconductor layer PV-i goes from the first junction surface toward the third intrinsic region i3 of the i-type semiconductor layer PV-i.

Further, a second intrinsic region i2 of the i-type semiconductor layer PV-i including the second junction surface does not contain germanium (Ge) at the second junction surface. Alternatively, the second intrinsic region i2 may contain about 1 to 5 at % of germanium (Ge). The amount of germanium (Ge) contained in the i-type semiconductor layer PV-i may increase as the i-type semiconductor layer PV-i goes from the second junction surface toward the third intrinsic region i3 of the i-type semiconductor layer PV-i.

In the configuration described above, interface characteristics between the first junction surface and the second junction surface of the i-type semiconductor layer PV-i are improved by reducing the amount of germanium (Ge) contained in the i-type semiconductor layer PV-i at the first junction surface abutting on the p-type semiconductor layer PV-p and the second junction surface abutting on the n-type semiconductor layer PV-n. Hence, carriers generated in the i-type semiconductor layer PV-i may easily move without a recombination and/or a disappearance of the carriers.

The energy band gap inside the i-type semiconductor layer PV-i may be reduced by relatively increasing an amount of germanium (Ge) in the third intrinsic region i3 between the first intrinsic region i1 and the second intrinsic region i2. Hence, the absorptance of light of the long wavelength band is improved, and the short circuit current Isc of the photoelectric conversion unit PV is improved.

The photoelectric conversion unit PV of the second cell C2 has to have the energy band gap less than the energy band gap of the photoelectric conversion unit PV of the first cell C1 by further increasing the amount of germanium (Ge) contained in the photoelectric conversion unit PV of the second cell C2 than the amount of germanium (Ge) contained in the photoelectric conversion unit PV of the first cell C1 positioned on the same level layer as the photoelectric conversion unit PV of the second cell C2. The reason for this is described below.

Figure 5A:
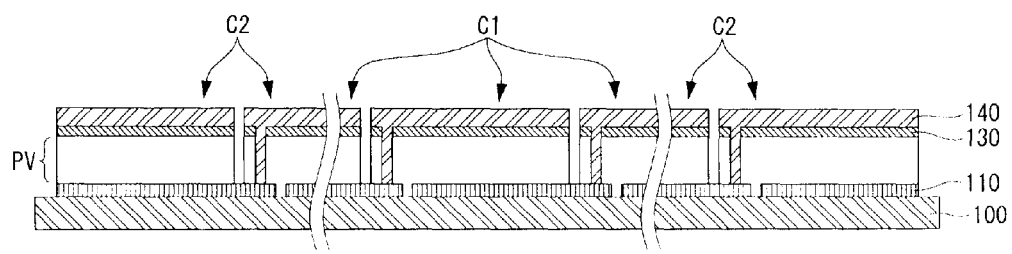
FIGS. 5A and 5B illustrate an effect according to the embodiment of the invention illustrated in FIGS. 1 and 3.
Figure 5B:
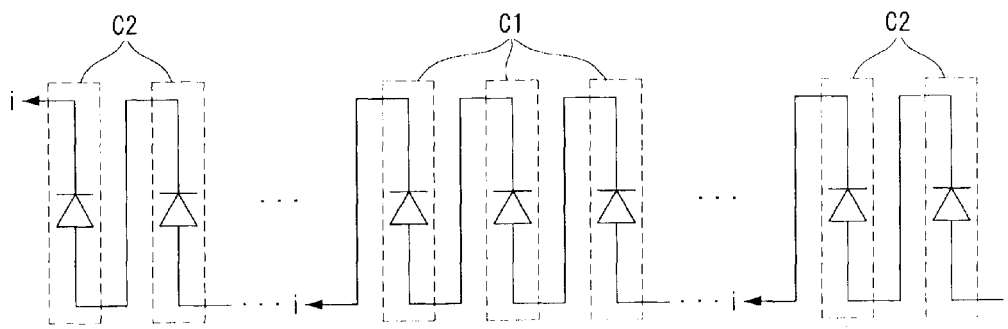

FIGS. 5A and 5B illustrate an effect according to an embodiment of the invention illustrated in FIGS. 1 and 3.

More specifically, FIG. 5A is a cross-sectional view taken along line V-V of FIG. 3, and FIG. 5B illustrates an equivalent circuit of FIG. 5A.

Since the configuration of each of the cells C1 and C2 of FIG. 5A is described above with reference to (a) of FIG. 4, a further description may be briefly made or may be entirely omitted.

As shown in FIG. 5A, the solar cell module according to the embodiment of the invention includes the plurality of first and second cells C1 and C2 which are connected in series to each other.

As shown in FIG. 5B an equivalent circuit of the serial connection structure of the plurality of first and second cells C1 and C2 is substantially the same as the serial connection structure of a plurality of diodes.

As shown in FIG. 5B, an electric current generated in each of the first and second cells C1 and C2, which are connected in series to each other, may flow along a uniform direction, for example, from the right to the left.

In the embodiment of the invention, the entire electric current output from the solar cell module is determined by the lowest electric current among the electric currents generated in all of the cells included in the solar cell module.

In this instance, a reduction in the electric current of the second cell C2, which is positioned to be closest to a current output terminal of the solar cell module in the edge area A2 of the solar cell module, adversely affects the entire characteristic of the electric current of the solar cell module.

In consideration of this, the photoelectric conversion unit PV of the second cell C2 has the energy band gap less than the photoelectric conversion unit PV of the first cell C1 by relatively increasing the amount of germanium (Ge) of the second cell C2 positioned in the edge area A2. Hence, even if the short circuit current Isc of the second cell C2 is reduced, a reduction in the entire efficiency of the solar cell module may be prevented.

More specifically, when the same amount of light is incident on the first and second cells C1 and C2 and the electric currents of the first and second cells C1 and C2 are separately measured, the electric current generated in the second cell C2 is greater than the electric current generated in the first cell C1 because of the lower energy band gap of the second cell C2.

However, because the edge area A2 is more easily polluted than the central area A1 due to pollutants such as dust, the incident amount of light on the second cell C2 positioned in the edge area A2 may be less than the incident amount of light on the first cell C1 positioned in the central area A1.

Considering this, an amount of electric current of the second cell C2 positioned in the edge area A2 may be less than an amount of electric current of the first cell C1 positioned in the central area A1.

However, in the embodiment of the invention, even if the amount of electric current of the second cell C2 positioned in the edge area A2 is reduced, the reduced amount of electric current of the second cell C2 may be compensated by the lower energy band gap resulting from the increase in the amount of germanium (Ge) of the second cell C2. Hence, the entire efficiency of the solar cell module may be improved.

The difference between the average amount of germanium (Ge) contained in the photoelectric conversion unit of the first cell C1 and the average amount of germanium (Ge) contained in the photoelectric conversion unit of the second cell C2 is about 1% to 20%. The reason is described below.

When the difference is equal to or greater than about 1%, a minimum difference between the short circuit currents Isc generated in the first and second cells C1 and C2 may be secured if the same amount of light is incident on the first and second cells C1 and C2. When the difference is equal to or less than about 20%, an excessive increase in a difference between the short circuit currents Isc generated in the first and second cells C1 and C2 may be prevented if the same amount of light is incident on the first and second cells C1 and C2. Hence, the electricity generation efficiency of the solar cell module may be improved, and the wasted current may be minimized.

For example, in FIG. 5B, when the current generated in the first cells C1 is about 5 mA and the current generated in the second cells C2 is about 6 mA, a final output current of the solar cell module is about 5 mA. Namely, the current of about 1 mA generated in the second cells C2 is not contributed to the final output current of the solar cell module and is wasted.

On the other hand, in FIG. 5B, when the current generated in the first cells C1 is about 5 mA and the current generated in the second cells C2 is about 10 mA, a final output current of the solar cell module is about 5 mA. Namely, the current of about 5 mA generated in the second cells C2 is not contributed to the final output current of the solar cell module and is wasted. In other words, the large amount of current is wasted, and thus the electricity generation efficiency of the solar cell module may be reduced.

In consideration of this, the difference between the average amounts of germanium (Ge) contained in the photoelectric conversion units of the first cell C1 and the second cell C2 may be about 1% to 20%, so as to minimize an amount of current, which does not contribute to the final output current of the solar cell module, and is wasted.

Figure 6:
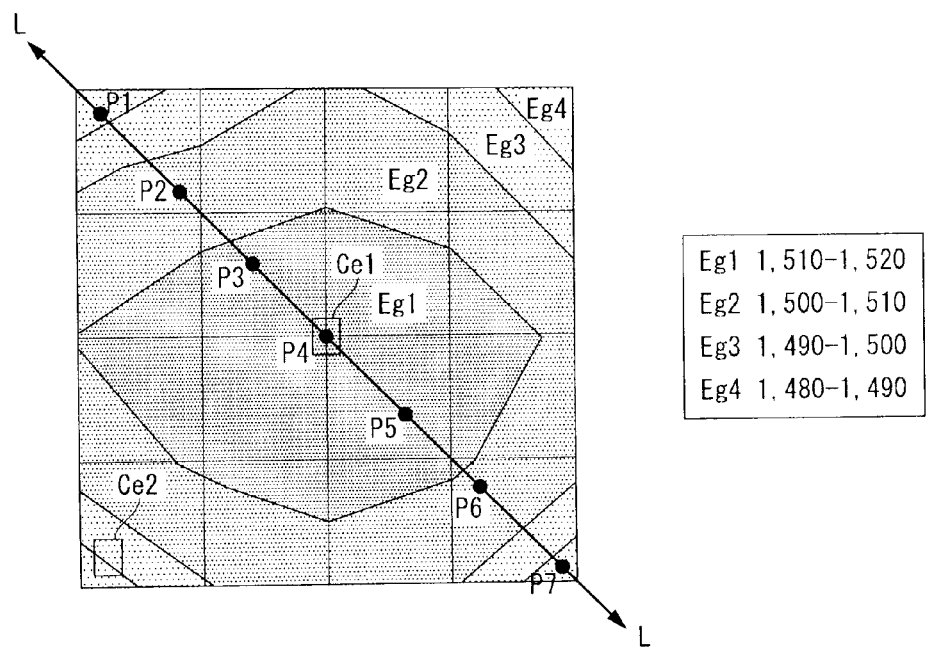
FIGS. 6 to 8 illustrate an energy band gap, an amount of germanium, and external quantum efficiency (EQE) when a solar cell module shown in FIGS. 1 to 3 is implemented as a single junction solar cell module.
Figure 7:
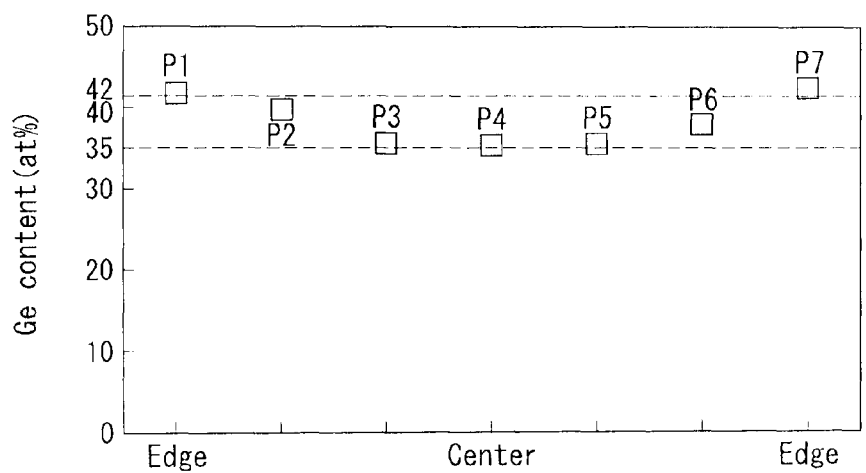
Figure 8:
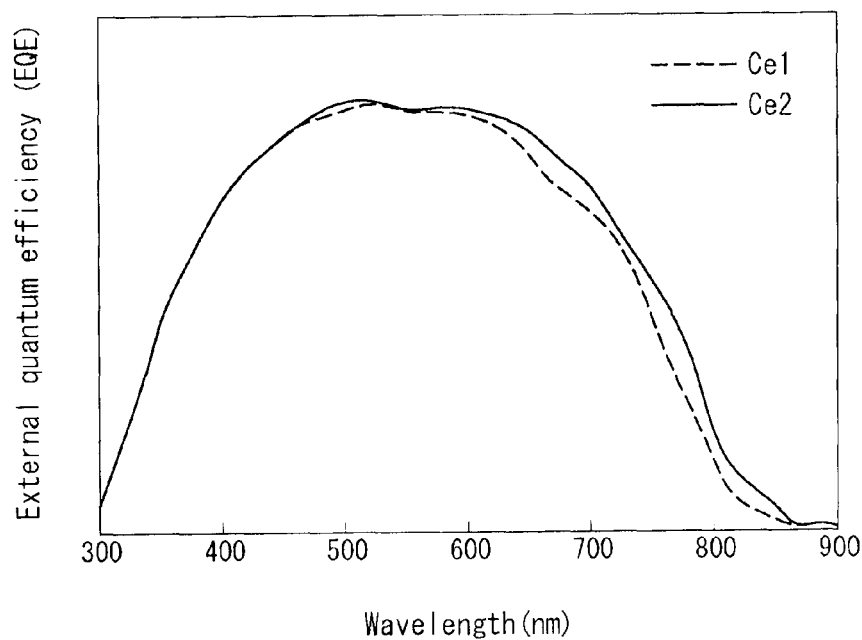

FIGS. 6 to 8 illustrate the energy band gap, the amount of germanium, and external quantum efficiency (EQE) when the solar cell module shown in FIGS. 1 to 3 is implemented as the single junction solar cell module.

More specifically, FIG. 6 illustrates the energy band gaps of the photoelectric conversion units (positioned on the same level layer) of the solar cell module. FIG. 7 illustrates the amount of germanium along the line L of FIG. 6. FIG. 8 illustrates the external quantum efficiency (EQE) depending on a wavelength when the central area A and the edge area A2 of the photoelectric conversion unit PV shown in FIG. 6 are partially manufactured as a coupon cell.

The results illustrated in FIGS. 6 to 8 are measured when the photoelectric conversion unit PV of each cell of the solar cell module implemented as the single junction solar cell module is formed of germanium-containing amorphous silicon (a-SiGe).

FIG. 6 illustrates the energy band gap of the photoelectric conversion unit PV of each cell of the solar cell module. The scribing line for dividing the cells of the solar cell module is omitted in FIG. 6.

As shown in FIG. 6, the energy band gaps of the photoelectric conversion units PV (positioned on the same level layer) of the solar cell module gradually decrease as the photoelectric conversion units PV go from the central area A1 (or the central area A1 of the substrate 100) to the edge area A2 (or the edge area A2 of the substrate 100).

More specifically, the energy band gap of the photoelectric conversion unit PV in the central area A1 (i.e., an Eg1 area) is about 1.510 to 1.520. Further, the energy band gap of the photoelectric conversion unit PV in the edge area A2 (i.e., Eg2 to Eg4 areas) is about 1.500 to 1.510, about 1.490 to 1.500, and about 1.480 to 1.490 and they are less than the energy band gap of the central area A1.

The energy band gap of the photoelectric conversion unit PV in the edge area A2, for example, the Eg4 area is less than the energy band gap of the photoelectric conversion unit PV in the central area A1 (i.e., the Eg1 area) by about 0.03 eV.

As shown in FIG. 7, the average amount of germanium of the photoelectric conversion unit PV along the line L of FIG. 6 is about 35 at % in the central area A1 (i.e., positions P3, P4, and P5) and is about 42 at % in the edge area A2 (i.e., positions P1 and P7). Thus, the average amount of germanium of the edge area A2 is greater than the average amount of germanium of the central area A1 by about 7%.

The amount of germanium may be adjusted by changing process variables (including a gap between the electrodes, a flowing amount of a process gas containing $H_2$, $SiH_4$, and $GeH_4$, a gas ratio $GeH_4/SiH_4$, etc.) when the photoelectric conversion unit PV is deposited using a plasma enhanced chemical vapor deposition (PECVD) method.

FIG. 8 illustrates the external quantum efficiency (EQE) depending on a wavelength after a portion of the photoelectric conversion unit PV in the central area A1 is manufactured as a first coupon cell Ce1 with the size of 1 cm$^2$ and a portion of the photoelectric conversion unit PV in the edge area A2 is manufactured as a second coupon cell Ce2 with the size of 1 cm$^2$.

As shown in FIG. 8, the EQE of the second coupon cell Ce2 is greater than the EQE of the first coupon cell Ce1.

More specifically, the EQE of the second coupon cell Ce2 further increases at a wavelength equal to or greater than about 600 nm. A sum of a current density of the second coupon cell Ce2 is greater than a sum of a current density of the first coupon cell Ce1 throughout the entire wavelength by about 5%.

Because an amount of germanium contained in the photoelectric conversion unit of the second coupon cell Ce2 is more than an amount of germanium contained in the photoelectric conversion unit of the first coupon cell Ce1, an energy band gap of the second coupon cell Ce2 is less than an energy band gap of the first coupon cell Ce1.

So far, the embodiment of the invention was described using the single junction solar cell as each cell of the solar cell module. However, the embodiment of the invention may be equally applied to a double junction solar cell or a triple junction solar cell.

Figure 9:
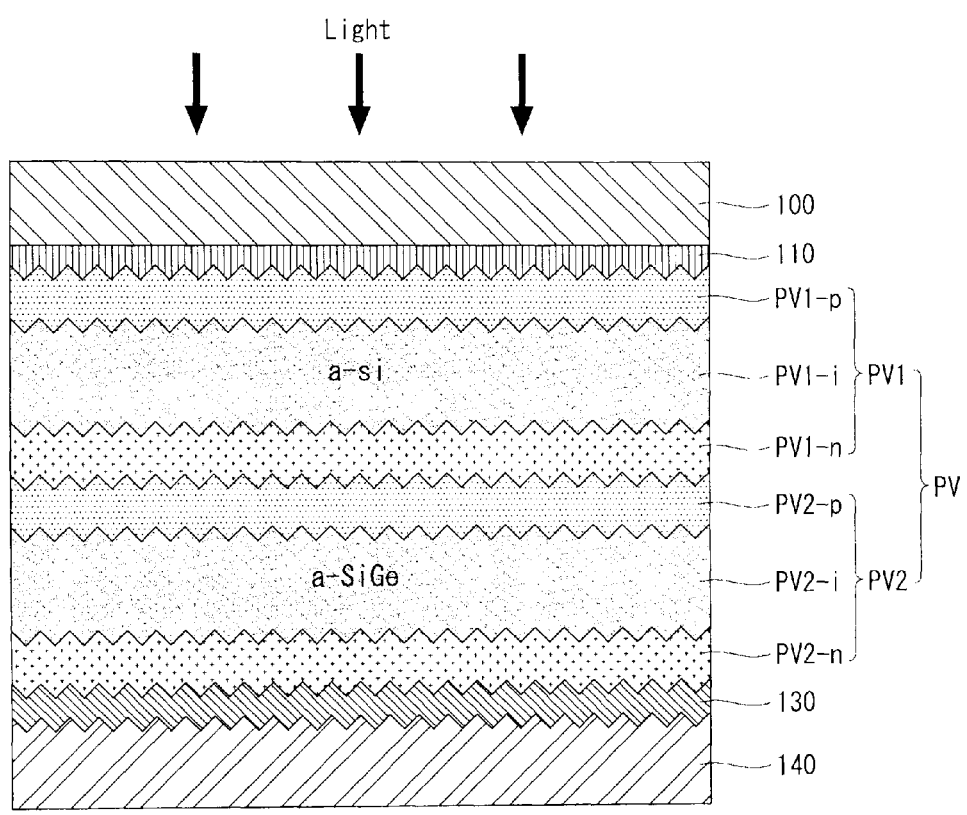
FIG. 9 illustrates an example where a solar cell module according to an exemplary embodiment of the invention includes a double junction solar cell having a p-i-n/p-i-n structure.

FIG. 9 illustrates an example where the solar cell module according to the embodiment of the invention includes a double junction solar cell having a p-i-n/p-i-n structure.

Structures and components identical or equivalent to those described above are designated with the same reference numerals, and a further description may be briefly made or may be entirely omitted.

As shown in FIG. 9, the double junction solar cell may include a first photoelectric conversion unit PV1 and a second photoelectric conversion unit PV2.

In the double junction solar cell shown in FIG. 9, a first p-type semiconductor layer PV1-$p$, a first i-type semiconductor layer PV1-$i$, a first n-type semiconductor layer PV1-$n$, a second p-type semiconductor layer PV2-$p$, a second i-type semiconductor layer PV2-$i$, and a second n-type semiconductor layer PV2-$n$ may be sequentially stacked on the incident surface of the substrate 100 in the order named. Other layers may be included or present in the photoelectric conversion unit PV.

The first i-type semiconductor layer PV1-$i$ may mainly absorb light of a short wavelength band to produce electrons and holes.

The second i-type semiconductor layer PV2-$i$ may mainly absorb light of a long wavelength band to produce electrons and holes.

As described above, because the double junction solar cell absorbs light of the short wavelength band and light of the long wavelength band to produce carriers, the efficiency of the solar cell module can be improved.

In the double junction solar cell shown in FIG. 9, the first i-type semiconductor layer PV1-$i$ of the first photoelectric conversion unit PV1 may contain amorphous silicon (a-Si), and the second i-type semiconductor layer PV2-$i$ of the second photoelectric conversion unit PV2 may contain germanium-containing amorphous silicon (a-SiGe).

In the double junction solar cell shown in FIG. 9, an amount of germanium contained in the second photoelectric conversion unit PV2 of the second cell C2 positioned in the edge area A2 of the solar cell module may be more than an amount of germanium contained in the second photoelectric conversion unit PV2 of the first cell C1 positioned in the central area A1 of the solar cell module.

Hence, the photoelectric conversion efficiency of the solar cell module may be improved as described above with reference to FIGS. 5A and 5B. As described above with reference to FIG. 4, an amount of germanium (Ge) contained in the second i-type semiconductor layer PV2-$i$ may gradually increase as the second i-type semiconductor layer PV2-$i$ goes from a junction surface abutting on the second p-type semiconductor layer PV2-$p$ and the second n-type semiconductor layer PV2-$n$ toward the third intrinsic region i3 of the second i-type semiconductor layer PV2-$i$.

In this instance, in the same measuring method as the single junction solar cell illustrated in FIG. 8, after a portion of the solar cell positioned in the central area A1 of the solar cell module is manufactured as a first coupon cell Ce1 with the size of about 1 cm$^2$ and a portion of the solar cell positioned in the edge area A2 of the solar cell module is manufactured as a second coupon cell Ce2 with the size of about 1 cm$^2$, the external quantum efficiency (EQE) depending on a wavelength is measured.

Figure 10:
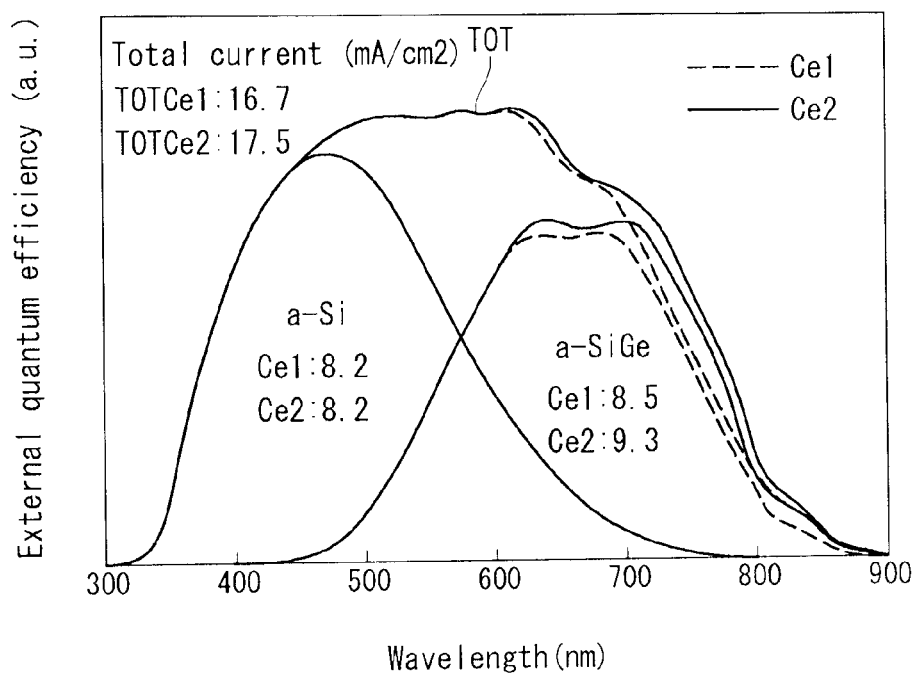
FIG. 10 illustrates external quantum efficiency (EQE) depending on a wavelength when a double junction solar cell positioned in a portion of a central area and a double junction solar cell positioned in a portion of an edge area are manufactured as coupon cells in a solar cell module including a double junction solar cell shown in FIG. 9.

FIG. 10 illustrates the external quantum efficiency (EQE) depending on a wavelength when the double junction solar cell positioned in a portion of the central area A1 and the double junction solar cell positioned in a portion of the edge area A2 are manufactured as coupon cells in the solar cell module including the double junction solar cell shown in FIG. 9.

As shown in FIG. 10, because the first photoelectric conversion unit PV1 containing amorphous silicon without germanium (Ge) absorbs light of a short wavelength band, the first photoelectric conversion unit PV1 mainly absorbs light having a wavelength of about 350 nm to 700 nm. Because there is not a difference between energy band gaps of the first coupon cell Ce1 and the second coupon cell Ce2, the same reflectance may be obtained irrespective of a wavelength band. Further, an output current of about 8.2 mA/cm$^2$ may be equally obtained in the first coupon cell Ce1 and the second coupon cell Ce2.

On the other hand, because the second photoelectric conversion unit PV2 mainly absorbs light of a long wavelength band, the second photoelectric conversion unit PV2 mainly absorbs light having a wavelength of about 550 nm to 850 nm. Because an amount of germanium (Ge) contained in the second photoelectric conversion unit PV2 of the first coupon cell Ce1 positioned in the central area A1 is less than an amount of germanium (Ge) contained in the second photoelectric conversion unit PV2 of the second coupon cell Ce2 positioned in the edge area A2, a reflectance of the second coupon cell Ce2 is greater than a reflectance of the first coupon cell Ce1 at a wavelength band equal to or greater than about 600 nm. Hence, the EQE of the second coupon cell Ce2 is greater than the EQE of the first coupon cell Ce1 at the wavelength band equal to or greater than about 600 nm.

Further, a current of the first coupon cell Ce1 is about 8.5 mA/cm$^2$, and a current of the second coupon cell Ce2 is about 9.3 mA/cm$^2$, which is greater than the first coupon cell Ce1.

Hence, a total current of the first coupon cell Ce1 is about 16.7 mA/cm$^2$, and a total current of the second coupon cell Ce2 is about 17.5 mA/cm$^2$ which is greater than the first coupon cell Ce1.

As a result, the efficiency of the solar cell module may be further improved.

Figure 11:
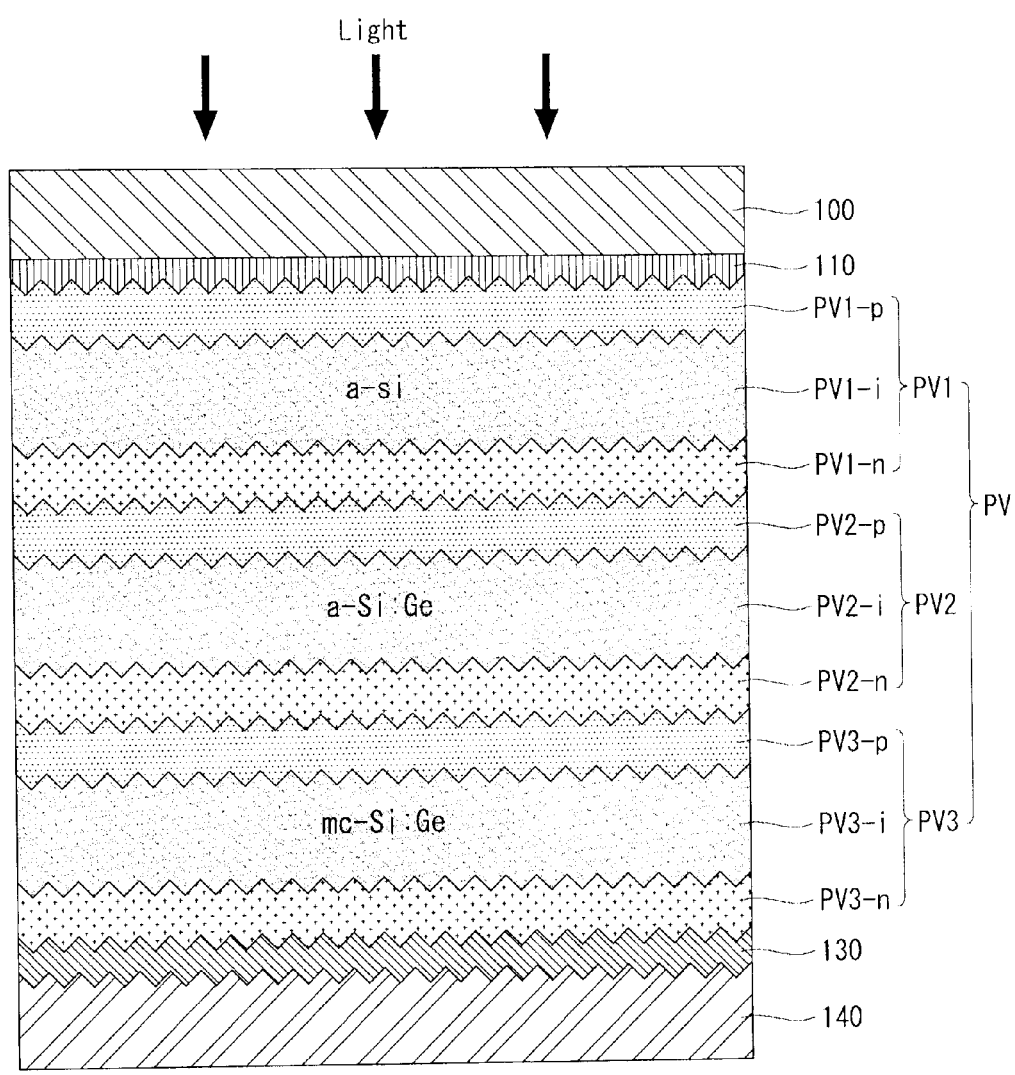
FIG. 11 illustrates an example where a solar cell module according to an exemplary embodiment of the invention includes a triple junction solar cell having a p-i-n/p-i-n/p-i-n structure.

FIG. 11 illustrates an example where the solar cell module according to the embodiment of the invention includes a triple junction solar cell having a p-i-n/p-i-n/p-i-n structure.

Structures and components identical or equivalent to those described above are designated with the same reference numerals, and a further description may be briefly made or may be entirely omitted.

As shown in FIG. 11, a thin film solar cell may include a first photoelectric conversion unit PV1, a second photoelectric conversion unit PV2, and a third photoelectric conversion unit PV3 that are sequentially positioned on the incident surface of the substrate 100 in the order named. Other layers may be included or present in the first, second and/or third photoelectric conversion units or therebetween.

Each of the first photoelectric conversion unit PV1, the second photoelectric conversion unit PV2, and the third photoelectric conversion unit PV3 may have the p-i-n structure in the embodiment of the invention. Thus, a first p-type semiconductor layer PV1-$p$, a first i-type semiconductor layer PV1-$i$, a first n-type semiconductor layer PV1-$n$, a second p-type semiconductor layer PV2-$p$, a second i-type semiconductor layer PV2-$i$, a second n-type semiconductor layer PV2-$n$, a third p-type semiconductor layer PV3-$p$, a third i-type semiconductor layer PV3-$i$, and a third n-type semiconductor layer PV3-$p$ may be sequentially positioned on the substrate 100 in the order named. Other layers may be included or present in the first, second, and/or third photoelectric conversion units or therebetween.

The first i-type semiconductor layer PV1-i, the second i-type semiconductor layer PV2-i, and the third i-type semiconductor layer PV3-i may be variously implemented.

As a first example of the configuration illustrated in FIG. 11, the first i-type semiconductor layer PV1-i may contain amorphous silicon (a-Si), the second i-type semiconductor layer PV2-i may contain germanium (Ge)-containing amorphous silicon (a-SiGe), and the third i-type semiconductor layer PV3-i may contain germanium (Ge)-containing microcrystalline silicon (μc-SiGe).

Both the second i-type semiconductor layer PV2-i and the third i-type semiconductor layer PV3-i may be doped with germanium (Ge).

An amount of germanium (Ge) contained in the third i-type semiconductor layer PV3-i may be more than an amount of germanium (Ge) contained in the second i-type semiconductor layer PV2-i. This is because the energy band gap decreases as the amount of germanium (Ge) increases. The reduction in the energy band gap is advantageous to absorb light of the long wavelength band.

Accordingly, when the amount of germanium (Ge) contained in the third i-type semiconductor layer PV3-i is more than the amount of germanium (Ge) contained in the second i-type semiconductor layer PV2-i, the third i-type semiconductor layer PV3-i may efficiently absorb light of the long wavelength band.

As a second example of the configuration illustrated in FIG. 11, the first i-type semiconductor layer PV1-i may contain amorphous silicon (a-Si), and the second i-type semiconductor layer PV2-i and the third i-type semiconductor layer PV3-i may contain microcrystalline silicon (μc-Si). An energy band gap of the third i-type semiconductor layer PV3-i may be reduced by doping only the third i-type semiconductor layer PV3-i with Ge as impurities.

As shown in FIG. 11, the embodiment of the invention is described below based on the first example in which, the first i-type semiconductor layer PV1-i and the second i-type semiconductor layer PV2-i contain amorphous silicon (a-Si), the third i-type semiconductor layer PV3-i contains microcrystalline silicon (μc-Si), and the second i-type semiconductor layer PV2-i and the third i-type semiconductor layer PV3-i contain germanium (Ge).

The first photoelectric conversion unit PV1 may absorb light of a short wavelength band, thereby producing electric power. The second photoelectric conversion unit PV2 may absorb light of a middle wavelength band between the short wavelength band and a long wavelength band, thereby producing electric power. The third photoelectric conversion unit PV3 may absorb light of the long wavelength band, thereby producing electric power.

A thickness of the third i-type semiconductor layer PV3-i may be greater than a thickness of the second i-type semiconductor layer PV2-i, and the thickness of the second i-type semiconductor layer PV2-i may be greater than a thickness of the first i-type semiconductor layer PV1-i.

For example, the thickness of the first i-type semiconductor layer PV1-i may be about 100 nm to 150 nm, the thickness of the second i-type semiconductor layer PV2-i may be about 150 nm to 300 nm, and the thickness of the third i-type semiconductor layer PV3-i may be about 1.5 μm to 4 μm.

The thicknesses are set so as to further increase an absorptance of the third i-type semiconductor layer PV3-i with respect to the light of the long wavelength band.

The triple junction solar cell shown in FIG. 11 may absorb light of the wider band and thus may further increase the production efficiency of electric power.

The triple junction solar cell may be configured, so that an amount of germanium (Ge) contained in the second photoelectric conversion unit PV2 of the second solar cell C2 positioned in the edge area A2 of the solar cell module is more than an amount of germanium (Ge) contained in the second photoelectric conversion unit PV2 of the first solar cell C1 positioned in the central area A1 of the solar cell module, in the same manner as the solar cell shown in FIGS. 1 to 3.

Further, the triple junction solar cell may be configured, so that an amount of germanium (Ge) contained in the third photoelectric conversion unit PV3 of the second solar cell C2 positioned in the edge area A2 of the solar cell module is more than an amount of germanium (Ge) contained in the third photoelectric conversion unit PV3 of the first solar cell C1 positioned in the central area A1 of the solar cell module.

As described above with reference to FIGS. 5A and 5B, the photoelectric conversion efficiency of the solar cell may be improved. Further, as described above with reference to FIG. 4, as it goes from a junction surface abutting on the second p-type semiconductor layer PV2-p and the second n-type semiconductor layer PV2-n toward the third intrinsic region i3 of the second i-type semiconductor layer PV2-i, the amount of germanium (Ge) may gradually increase. Further, as it goes from a junction surface abutting on the third p-type semiconductor layer PV3-p and the third n-type semiconductor layer PV3-n toward the third intrinsic region i3 of the third i-type semiconductor layer PV3-i, the amount of germanium (Ge) may gradually increase.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film solar cell module comprising:
    a substrate;
    a plurality of first cells in a central area of the substrate, each first cell including a first electrode, a second electrode, and at least one photoelectric conversion unit between the first electrode and the second electrode; and
    a plurality of second cells in an edge area of the substrate, each second cell including a first electrode, a second electrode, and a photoelectric conversion unit between the first electrode and the second electrode,
    wherein an area or a width of each of the first cells and an area or a width of each of the second cells are equal to each other,
    wherein an amount of germanium (Ge) in the photoelectric conversion unit of at least one first cell is less than an amount of Ge in the photoelectric conversion unit of at least one second cell,
    wherein the photoelectric conversion unit of the at least one second cell having relatively more Ge content is on a same level layer as the photoelectric conversion unit of the at least one first cell having relatively less Ge content,
    wherein the at least one first cell includes at least two areas containing a different amount of Ge, and
    wherein the at least two areas are in a longitudinal direction of the at least one first cell.

2. The thin film solar cell module of claim 1, wherein each first cell and each second cell include a same number of photoelectric conversion units.

3. The thin film solar cell module of claim 1, wherein a difference between an average amount of Ge in the photoelectric conversion unit of the at least one first cell and an average amount of Ge in the photoelectric conversion unit of the at least one second cell is 1% to 20%.

4. The thin film solar cell module of claim 1, further comprising at least another first cell in an intermediate area between the central area and the edge area of the substrate, wherein an amount of Ge in the photoelectric conversion units of the at least one first cell and the at least one second cell, which are on the same level layer, increases from the at least one first cell in the central area, to the at least another first cell in the intermediate area, and to the at least one second cell in the edge area of the substrate.

5. The thin film solar cell module of claim 1, wherein the amount of Ge in the photoelectric conversion unit of the at least one first cell gradually increases from the at least one first cell at the central portion to the at least one first cell at both ends of the at least one first cells along the longitudinal direction of the at least one first cells.

6. The thin film solar cell module of claim 1, wherein the amount of Ge in the photoelectric conversion units of the at least one first cell at both ends of the longitudinal direction of the at least one first cell is substantially equal to the amount of Ge in one or more of the photoelectric conversion units of the at least one second cell.

7. The thin film solar cell module of claim 1, wherein the thin film cell module comprises the plurality of second cells including respective photoelectric conversion units on the substrate, and the amount of Ge in the respective photoelectric conversion unit of the at least one second cell varies along a longitudinal direction of the at least one second cell.

8. The thin film solar cell module of claim 7, wherein the amount of Ge in the at least one second cell at both ends of the longitudinal direction of the at least one second cells is more than the amount of Ge in the at least one second cell at a central portion of the longitudinal direction of the at least one second cell.

9. The thin film solar cell module of claim 8, wherein the amount of Ge in the photoelectric conversion unit of the at least one second cell gradually increases from the at least one second cell at the central portion to the at least one second cell at both ends of the at least one second cell along the longitudinal direction of the at least one second cell.

10. The thin film solar cell module of claim 7, wherein the amount of Ge in the photoelectric conversion unit of the at least one second cells at a central portion is substantially equal to the amount of Ge in the photoelectric conversion unit of the at least one first cell at both ends of the longitudinal direction of the at least one first cell.

11. The thin film solar cell module of claim 1, wherein each of the photoelectric conversion units of the each first cell and the each second cell includes a p-type semiconductor layer, an intrinsic (i-type) semiconductor layer, and an n-type semiconductor layer,
wherein an average amount of Ge in the i-type semiconductor layer of the each second cell is more than an average amount of Ge in the i-type semiconductor layer of the each first cell.

12. The thin film solar cell module of claim 11, wherein a difference between the average amount of Ge in the i-type semiconductor layer of the each second cell and the average amount of Ge in the i-type semiconductor layer of the each first cell is 1% to 20%.

13. The thin film solar cell module of claim 11, wherein the respective i-type semiconductor layer of the each first cell and the each second cell comprise a first intrinsic region, a second intrinsic region, and a third intrinsic region therebetween, and the amount of Ge in the i-type semiconductor layers of the photoelectric conversion units of the each first cell and the each second cell gradually increases as the photoelectric conversion units go from a first junction surface abutting on the p-type semiconductor layer and a second junction surface abutting on the n-type semiconductor layer toward the third intrinsic region of the i-type semiconductor layers of the each first cell and the each second cell.

14. The thin film solar cell module of claim 11, wherein the i-type semiconductor layers of the photoelectric conversion units of the first and second cells, which are on the same level layer, contain amorphous silicon germanium (a-SiGe) or microcrystalline silicon germanium (µc-SiGe).

15. The thin film solar cell module of claim 1, wherein the amount of Ge in the photoelectric conversion units of the at least one first cell and the at least one second cell, which are on the same level layer, gradually increases as the photoelectric conversion units radially go from the central area to the edge area of the substrate.

16. The thin film solar cell module of claim 1, wherein the at least one first cell in a central area of the substrate includes a first photoelectric conversion unit containing amorphous silicon (a-Si) and a second photoelectric conversion unit containing germanium-containing amorphous silicon (a-SiGe), and the at least one second cell positioned in an edge area of the substrate includes a first photoelectric conversion unit containing a-Si and a second photoelectric conversion unit containing a-SiGe, wherein the amount of Ge in the second photoelectric conversion unit of the at least one first cell is less than an amount of Ge in the photoelectric conversion unit of the at least one second cell.

17. The thin film solar cell module of claim 1, wherein the at least one first cell in a central area of the substrate includes a first photoelectric conversion unit containing amorphous silicon (a-Si), a second photoelectric conversion unit containing germanium-containing amorphous silicon (a-SiGe), and a third photoelectric conversion unit containing germanium-containing microcrystalline silicon (µc-SiGe) and the at least one second cell in an edge area of the substrate includes a first photoelectric conversion unit containing a-Si, a second photoelectric conversion unit containing a-SiGe, and a third photoelectric conversion unit containing µc-SiGe, wherein the amount of Ge in the second photoelectric conversion unit of a corresponding first cell and second cell is less than an amount of Ge in the third photoelectric conversion unit of a corresponding first cell and second cell.

18. The thin film solar cell module of claim 17, wherein a thickness of the third photoelectric conversion unit is greater than a thickness of the second photoelectric conversion unit and the thickness of the second photoelectric conversion unit is greater than a thickness of the first photoelectric conversion unit in the corresponding first cell and second cell.

19. The thin film solar cell module of claim 1, wherein the at least two areas include a first area and a second area, and
wherein the first area is in a central area of the substrate, and the second area is in both ends of the at least one first cell.

20. The thin film solar cell module of claim 19, wherein an amount of Ge in the first area is less than an amount of Ge in the second area, and wherein the amount of Ge is equal to each other in the first area, and the amount of Ge is equal to each other in the second area.

* * * * *